(12) United States Patent
Fujisaki et al.

(10) Patent No.: US 7,057,909 B2
(45) Date of Patent: Jun. 6, 2006

(54) CURRENT/CHARGE-VOLTAGE CONVERTER

(75) Inventors: Tomoya Fujisaki, Tokyo (JP); Masaharu Goto, Saitama (JP)

(73) Assignee: Agilent Technologies, Inc., Palo Alto, CA (US)

( * ) Notice: Subject to any disclaimer, the term of this patent is extended or adjusted under 35 U.S.C. 154(b) by 39 days.

(21) Appl. No.: 10/982,209

(22) Filed: Nov. 5, 2004

(65) Prior Publication Data
US 2005/0105309 A1    May 19, 2005

(30) Foreign Application Priority Data
Nov. 19, 2003 (JP) ............................. 2003-389206
Sep. 24, 2004 (JP) ............................. 2004-277011

(51) Int. Cl.
*H02M 7/00*    (2006.01)

(52) U.S. Cl. .................... 363/73; 323/288; 323/316

(58) Field of Classification Search ................. 363/73, 363/74; 323/313, 314, 316, 285, 288; 324/658, 324/678, 686
See application file for complete search history.

(56) References Cited

U.S. PATENT DOCUMENTS

| 4,504,776 A | * | 3/1985 | Haville ........................ 323/288 |
| 5,734,293 A | * | 3/1998 | Gross .......................... 323/316 |
| 6,366,099 B1 | * | 4/2002 | Reddi .......................... 324/678 |

FOREIGN PATENT DOCUMENTS

| JP | 05-126864 | 5/1993 |
| JP | 2002-221540 | 8/2002 |

* cited by examiner

*Primary Examiner*—Jessica Han

(57) ABSTRACT

A current/charge-voltage convert circuit having an operational amplifier and a capacitor connected between the input terminal and the output terminal of the operational amplifier, this current/charge-voltage convert circuit characterized in that it comprises a first pair of diodes connected in mutually opposing directions to this input terminal, a second pair of diodes connected in the opposite direction of this first pair of diodes to the respective other terminal of this first pair of diodes, a pair of current sources connected in mutually opposing directions to the respective other terminal of this first pair of diodes, a pair of switches connected to the respective other terminal of this first pair of diodes, and resistors connected between the respective other terminal of this second pair of diodes.

6 Claims, 3 Drawing Sheets

CURRENT/CHARGE-VOLTAGE CONVERTER

BACKGROUND OF THE INVENTION

1. Field of the Invention

The present invention relates to a current/charge-voltage convert circuit that uses an integrating circuit, and in particular, relates to a current/charge-voltage convert circuit having means to discharge the charge that has accumulated in the integrating capacitor.

2. Discussion of the Background Art

Current/charge-voltage convert circuits that use an integrating circuit are employed in current measuring devices, charge measuring devices, and other devices. These are circuits wherein, as shown in the integrating circuit 1 of FIG. 2, integrating capacitor 11 is connected between the inverted input terminal and the output terminal of an operational amplifier 10, integrating capacitor 11 is charged by current from the current source of the device under test 3, the amount of charge is measured by measuring the integrated voltage V, and the amount of current is measured by finding the change in the integrated voltage V.

When multiple tests are being performed with an integrating circuit that uses capacitor 11, it is necessary to discharge capacitor 11 for each measurement such that the integrating voltage V does not become saturated. The simplest discharge method is the method whereby switches are connected to both terminals of capacitor 11 and the switches are turned on at the time of discharge to short-circuit both terminals of capacitor 11. While this type of circuit has a simple structure, when FETs or other types of electronic switches are used as the switches, control signals are applied to the electrodes under control, which are based on the capacitance between the control electrodes and the electrodes under control, and a charge therefore is introduced to capacitor 11, making thorough discharge impossible. Moreover, although a charge is not introduced to the capacitor when mechanical switches are used, there is the problem here that the operating speed is insufficient.

Therefore, the method in JP (Kokai) 5-126,864 was proposed whereby diodes 200 and 201 are disposed on the inverted input terminal side of switch 203 and the other terminal of diodes 200 and 201 are fixed at a constant voltage, as shown in FIG. 2. By means of this type of circuit, the inverted input terminal side of switch 203 is always grounded via resistor 202 and the voltage of junction J1 is fixed at 0 V. When a potential of threshold voltage (approximately 0.6 V) or higher is applied in the forward direction, diodes 200 and 201 are in a connected state, but the inverted input terminal of operational amplifier 10 becomes the same potential of 0 V as the non-inverted input terminal, which is the same potential as junction J1. Therefore, when switch 203 is off, the diodes are in a stable, disconnected state and an inflow of current from the current source of the device under test 3 can be prevented.

However, even if switch 203 is on, a threshold voltage (approximately 0.6 V) is generated between junctions J1 and J2; therefore, when the voltage between the two terminals of capacitor 11 becomes the threshold voltage or less, diodes 200 and 201 become disconnected. Consequently, the voltage at both terminals of capacitor 11 cannot be discharged to the threshold voltage or less.

Therefore, the circuit shown in FIG. 3 was proposed (refer to JP (Kokai) 2002-221,540). By means of this circuit, a positive and a negative electrode (+V and −V) are disposed midway between junctions J1 and J2 and eight diodes 210 through 217 are disposed leading from the power source to each of junctions J1 and J2 in order to balance the voltage of junctions J1 and J2.

When switches 222 and 223 are turned on in order to discharge capacitor 11, the current from power source +V is split between the diodes 212 and 214 and current flows into power source −V through two paths, the path of diodes 210, 211, and 213 and the path of diodes 216, 217, and 215. Capacitor 11 is thoroughly discharged at this time because junctions J1 and J2 are brought to the same potential as a result of the current having traveled from power source +V through the same number of diodes.

On the other hand, when tests are being performed (when capacitor 11 is non-discharging), switches 222 and 223 are turned off and current does not flow into the diodes. Junctions E and F on the side of current source 3 of the device under test are grounded via resistors 218 and 219. Therefore, the inflow of current from the current source of the device under test 3 can be prevented, as shown by the circuit in FIG. 2.

Thus, while the circuit in FIG. 3 has an advantage in that the inflow of current from the current source of the device under test 3 can be prevented and capacitor 11 can be thoroughly discharged, its circuit structure is very complex because eight diodes are used. Moreover, it is necessary to use diodes with coinciding electrical properties in order to keep junctions J1 and J2 at the same potential.

The method whereby the circuit is simplified by eliminating diodes 212 through 215 has been considered because of the complexity of the above-mentioned circuit structure. However, when diodes 212 through 215 are eliminated, the output voltage V of operational amplifier 10 moves through diodes 216 and 217 and resistors 218 and 219 to become a flowing current. Therefore, a large reverse bias is applied to diodes 210 and 211 and a large leakage current flows to the inverted terminal side of operational amplifier 10. There is a problem in that when a charge is applied to capacitor 11 by this leakage current, the measurement accuracy deteriorates.

SUMMARY OF THE INVENTION

The present invention solves the above-mentioned problems by a current/charge-voltage convert circuit having an operational amplifier and a capacitor connected between the input terminal and the output terminal of the operational amplifier, this current/charge-voltage convert circuit characterized in comprising a first pair of diodes connected in mutually opposing directions to this input terminal, a second pair of diodes connected in the opposite direction of this first pair of diodes to the respective other terminal of this first pair of diodes, a pair of current sources connected in mutually opposing directions to the respective other terminal of this first pair of diodes, a pair of switches connected to the respective other terminal of this first pair of diodes, and resistors connected between the respective other terminal of this second pair of diodes.

DETAILED DESCRIPTION OF THE PREFERRED EMBODIMENT

A testing device and a method that are preferred embodiments of the present invention will now be described in detail while referring to the attached drawings.

Figure 1:
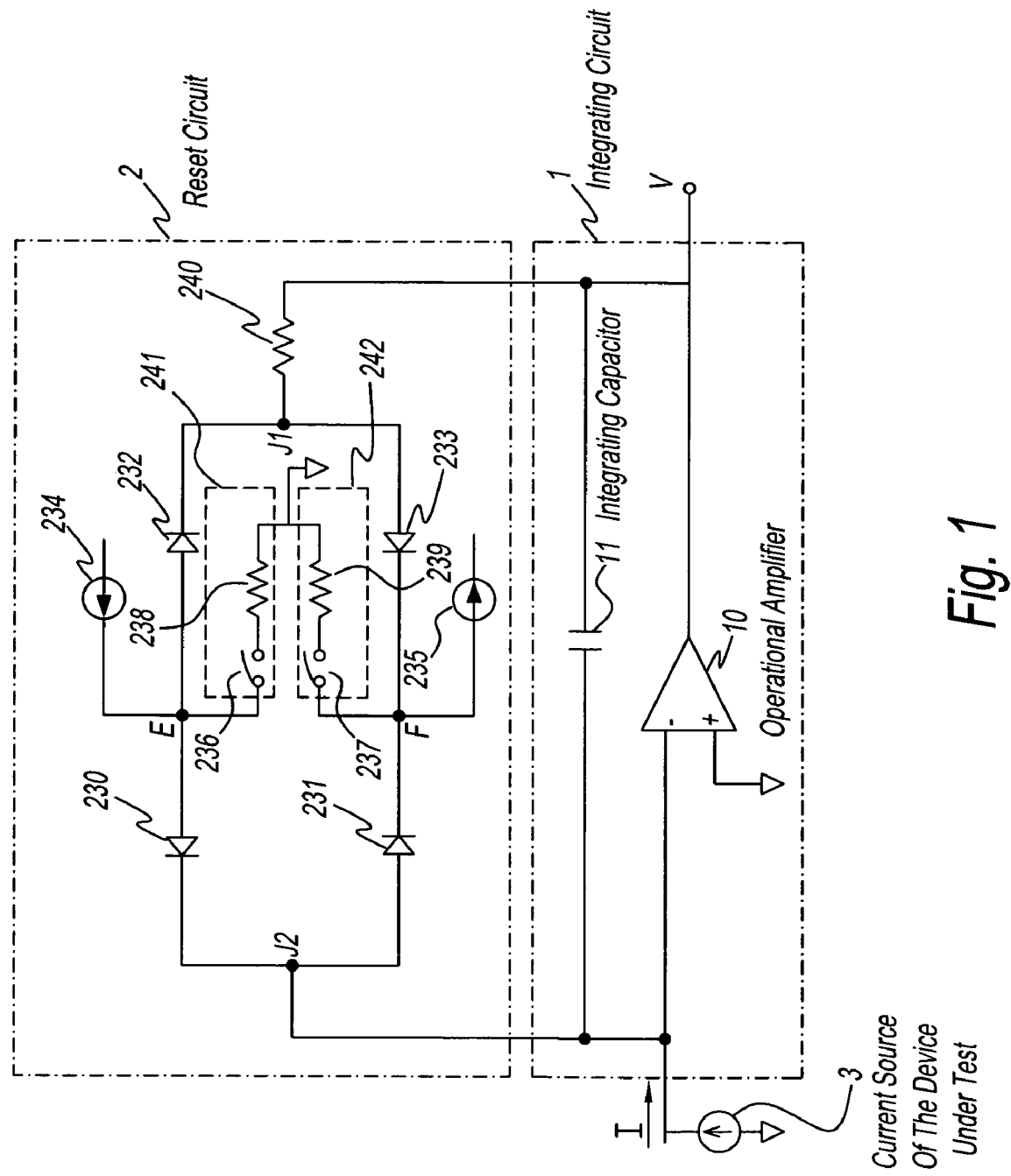
FIG. 1 is a circuit diagram of the current/charge-voltage convert circuit that is a working example of the present invention.
Figure 2:
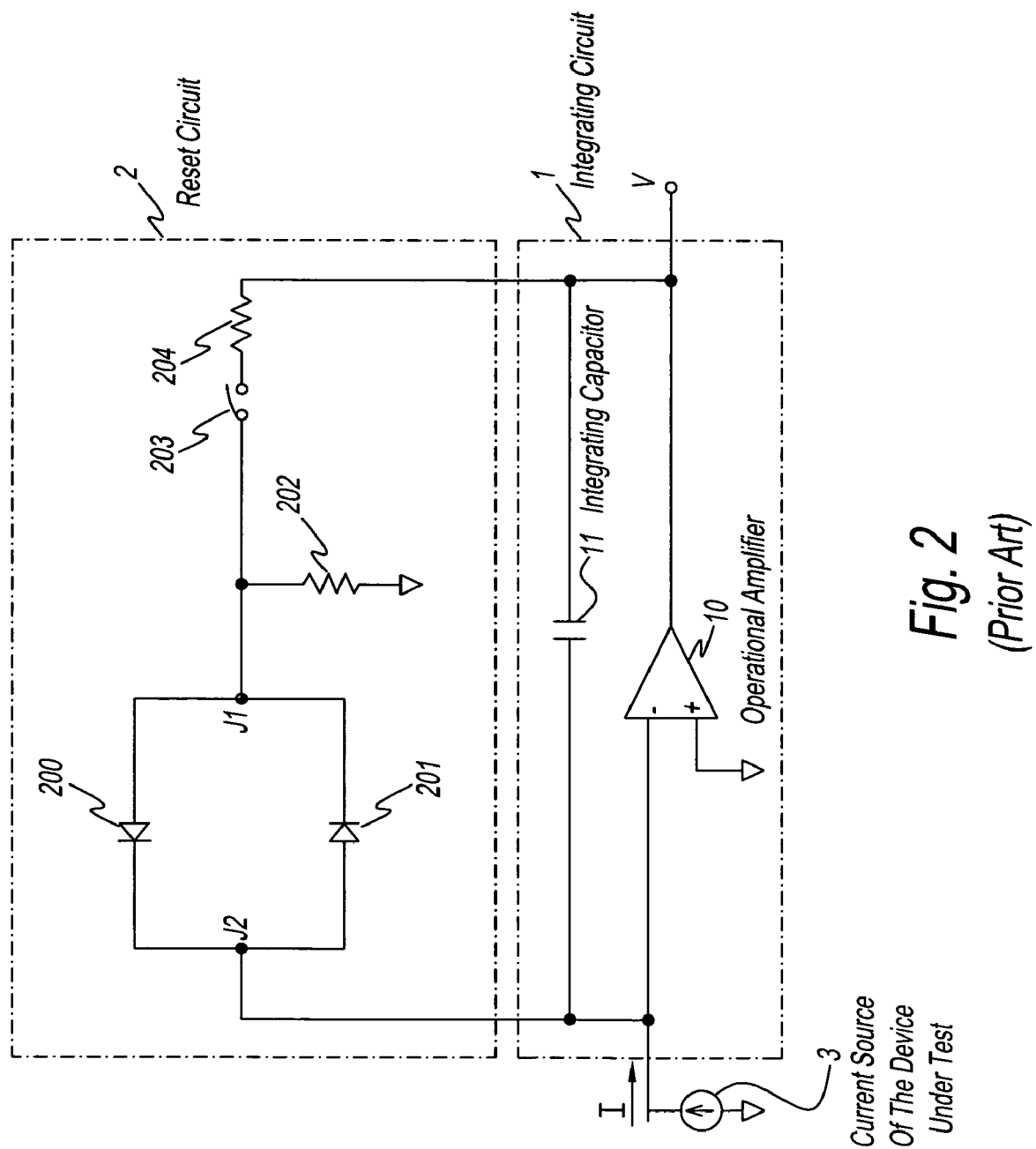
FIG. 2 is a conventional circuit diagram of a current/charge-voltage convert circuit.
Figure 3:
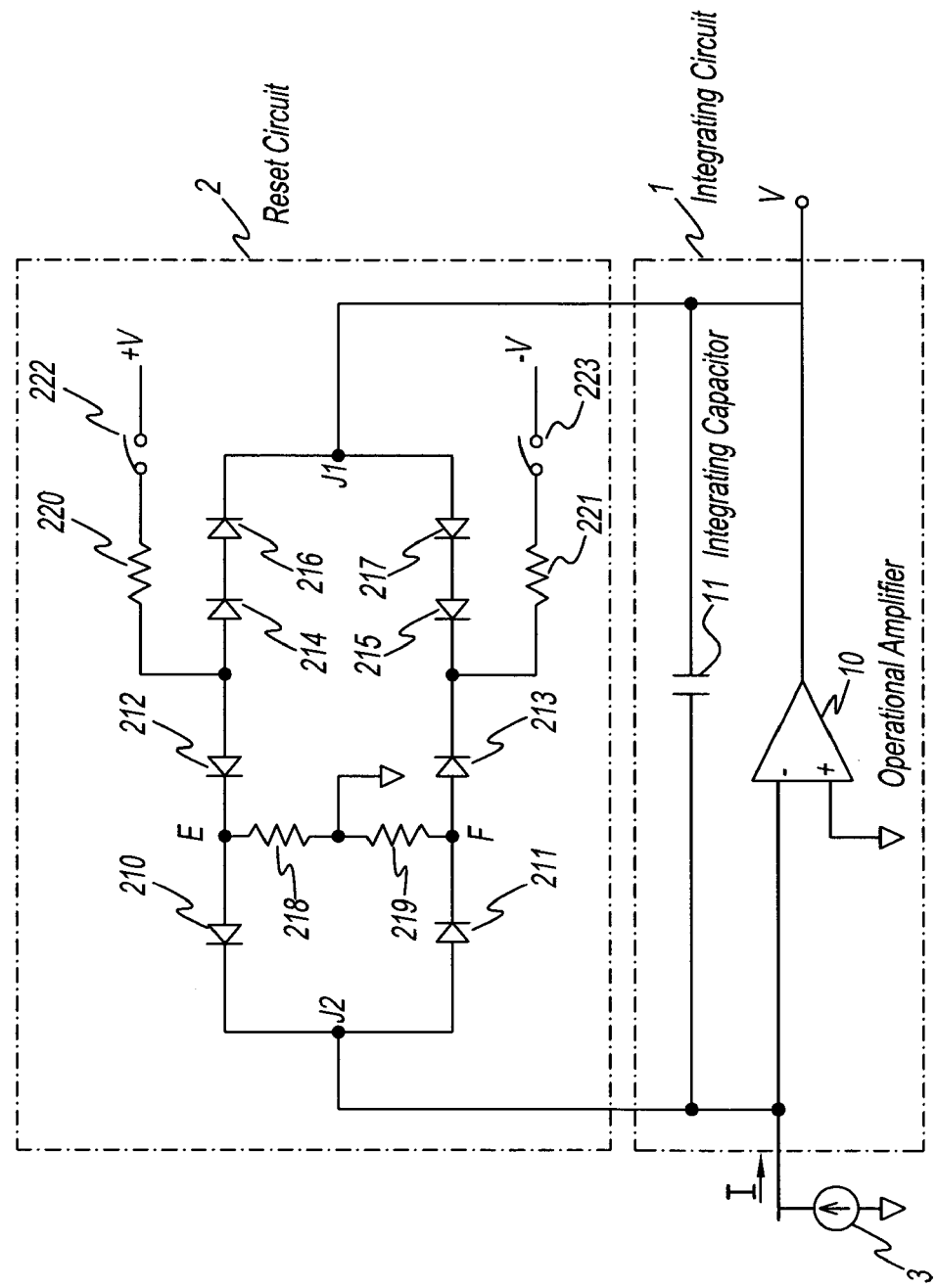
FIG. 3 is a conventional circuit diagram of a current/charge-voltage convert circuit.

FIG. 1 shows a circuit diagram of the current/charge-voltage convert circuit pertaining to the present invention. The current/charge-voltage convert circuit comprises an integrating circuit 1 and a reset circuit 2. Integrating circuit 1 comprises an operational amplifier 10 and an integrating capacitor 11 connected between the inverted input terminal and the output terminal of operational amplifier 10. A current source of device under test 3 is connected to the input terminal of operational amplifier 10. Moreover, reset circuit 2 comprises a pair of diodes 230 and 231 connected in mutually opposing directions to the input terminal of operational amplifier 10, diodes 232 and 233 connected in mutually opposing directions to each other terminal of diodes 230 and 231, constant current sources 234 and 235 with a current of 200 μA that flows in the direction in which current flows into junction E and out from junction F between diodes 230 and 232 and between diodes 231 and 233, FET switches 241 and 242 connected between diodes 230 and 232 and diodes 231 and 233, and a 2-kΩ resistor 240 connected between diodes 232 and 233 and the output terminals of operational amplifier 10.

FET switches 241 and 242 which are shown in FIG. 1 are divided into switch components 236 and 237 and on-resistance components 238 and 239 in order to describe circuit operation. Switches 241 and 242 can also be analog switches, relays, and the like instead of FETs. Moreover, constant current sources 234 and 235 can be a constant voltage source and a resistor connected in series.

Operation of the circuit will now be described. The inverted input terminal of operational amplifier 10 of integrating circuit 1 is in a state of high impedance; therefore, current from the current source of the device under test 3 accumulates in integrating capacitor 11. Capacitor 11 can be thoroughly discharged by a simple circuit structure using the current/charge-voltage convert circuit of the present invention. The noninverted terminal is grounded; therefore, the inverted terminal is also at 0 V. Charge Q supplied from the current source of the device under test 3 can be found by Q=C×V (C is the capacitance of capacitor 11 and V is the output voltage of operational amplifier 10.). Moreover, current I can be found from the change in charge Q per unit of time, or I=C×dV/dt. As a result, charge Q and current I supplied from the current source of device under test 3 can be measured by measuring the output voltage V.

However, there are limits to the capacitance of capacitor 11 and the output voltage of operational amplifier 10. It is therefore necessary to discharge the charge of capacitor 11 as needed when testing is being performed continuously. Reset circuit 2 discharges capacitor 11 when FET switches 241 and 242 are both off and brings the capacitor to the non-discharged state when the switches are both on.

First, when FET switches 241 and 242 are both on, the current from current sources 234 and 235 flows to ground 244 through FETs 241 and 242. FET switches 241 and 242 and analog switches 238 and 239 have on-resistors 238 and 239 of approximately 50 Ω and the current of current sources 234 and 235 becomes 200 μA. Therefore, the voltage drop due to on-resistors 238 and 239 becomes approximately 10 mV (=50 Ω×200 μA). The voltage drop due to on-resistors 238 and 239 is the threshold voltage (approximately 0.6 V) of the diodes or lower, and therefore, diodes 230 and 231 are kept in an off-state. If the current of current sources 234 and 235 is approximately 12 mA (=0.6 V/50 Ω), the voltage of junctions E and F becomes 0.6 V or less and diodes 230 and 231 are kept in an off-state. Therefore, it is possible to prevent current from the current source of device under test 3 from flowing into reset circuit 2 and to control the leakage current from current sources 234 and 235 to the input terminal of operational amplifier 10. In addition, even if noise is generated, it is possible to keep the potential of junctions E and F at the threshold voltage of diodes 230 and 231 or lower by allowing current to flow continuously from current sources 234 and 235 to ground when in a non-discharged state. Testing can be performed with strong noise properties and with high accuracy.

On the other hand, diodes 232 and 233 are connected to the output terminal side of operational amplifier 10 and current flows from operational amplifier 10 through resistor 240 to diode 232 or 233. The load on operational amplifier 10 increases with an increase in this current until the voltage drop by on-resistors 238 and 239 exceeds the threshold voltage of diodes 230 and 231 and current leaks from current sources 234 and 235 to capacitor 11. Therefore, the resistance of resistor 240 must be sufficiently greater than that of internal resistors 238 and 239.

Next, the operation of capacitor 11 when FET switches 241 and 242 are both off, that is, during discharge, will be described. FET switches 236 and 237 are off during discharge. Therefore, the current from current source 234 cannot flow into FET switches 241 and 242. As a result, the current from current source 234 is split between diodes 230 and 232 and flows through diodes 231 and 233 to current source 235. Junctions J1 and J2 are both at a voltage that differs from that of junctions E and F by just the threshold voltage of the diode; therefore, they are at the same potential. Consequently, the voltage of both terminals of capacitor 11 becomes the same potential and the charge that has accumulated in capacitor 11 is discharged through any of diodes 230 to 233. The current from capacitor 11 at this time is sufficiently smaller than the current of current sources 234 and 235, and the voltage between the two terminals of each of diodes 230 through 233 is kept almost constant, regardless of changes in current. As a result, the balanced voltage at junctions J1 and J2 is not destroyed by the charge from capacitor 11. Capacitor 11 can be thoroughly discharged by keeping junctions J1 and J2 stable at the same potential.

It should be noted that the current source [of device] under test 3 of the present invention includes active current sources that supply the current themselves, as well as resistors, capacitors, and other passive elements that supply current by application of voltage from the outside. When testing this type of passive element, the test is conducted with the power source inserted between the ground potential of integrating circuit 1 and reset circuit 2 and the ground potential of the current source of the device under test 3. For instance, when resistance R of a resistor is to be measured, the resistor is set in the position of the current source of the device under test 3, a power source is inserted at the grounded part of integrating circuit 1 and reset circuit 2, and a voltage difference Vin is set up between the grounded potential of integrating circuit 1 and reset circuit 2 and the grounded potential of the current source of the device under test 3. The voltage of the inverted terminal of operational amplifier 10 at this time becomes Vin and the constant current source I determined from the voltage difference Vin and resistance R (I=Vin/R) therefore flows to the resistor under test. That is, the resistor under test acts in the same way as the current source of the device under test in the above-mentioned working example. It is possible to measure resistance R by finding this current I. At the same time, it is possible to apply the same bias voltage as in a state of actual use by setting a potential difference between the grounded potential of integrating circuit 1 and reset circuit 2 and the grounded potential of the current source of the device under test when testing TFT arrays and semiconductors.

In addition, the voltage and other numerical parameters used in this working example are merely illustrations; these can be selected as needed in accordance with the device under test and the testing method and do not limit in any way the scope of the present invention.

What is claimed is:

1. A current/charge-voltage convert circuit having an operational amplifier and a capacitor connected between the input terminal and the output terminal of the operational amplifier, said current/charge-voltage convert circuit comprising:
    a first pair of diodes connected in mutually opposing directions to said input terminal;
    a second pair of diodes connected in the opposite direction of said first pair of diodes to the respective other terminal of said first pair of diodes;
    a pair of current sources connected in mutually opposing directions to the respective other terminal of said first pair of diodes;
    a pair of switches connected to the respective other terminal of said first pair of diodes; and
    resistors connected between the respective other terminal of said second pair of diodes.

2. The current/charge-voltage convert circuit according to claim 1,
    wherein said switches are analog switches.

3. The current/charge-voltage convert circuit according to claim 1, wherein said switches are transistors.

4. A current/charge-voltage convert circuit having an operational amplifier and a capacitor connected between the input terminal and the output terminal of said operational amplifier, said current/charge-voltage convert circuit comprising:
    a first and second diode, wherein one terminal of each is connected in the mutually opposing direction to said input terminal;
    a resistor, wherein one terminal is connected to said output terminal;
    a third diode, wherein one terminal is connected in the opposing direction of said first diode to the other terminal of said first diode and the other terminal is connected to the other terminal of this resistor;
    a fourth diode, wherein one terminal is connected in the opposing direction of said second diode to the other terminal of said second diode and the other terminal is connected to the other end of this resistor;
    a first switch connected to the other terminal of this said diode and one terminal of the third diode;
    a first current source connected to the other terminal of said first diode and one terminal of the third diode;
    a second switch connected to the other terminal of said second diode and one terminal of the fourth diode; and
    a second current source connected to the other terminal of said second diode and one terminal of the fourth diode.

5. The current/charge-voltage convert circuit according to claim 4, wherein said switches are analog switches.

6. The current/charge-voltage convert circuit according to claim 4, wherein said switches are transistors.

* * * * *